United States Patent
Casey et al.

(10) Patent No.: US 9,015,007 B2
(45) Date of Patent: Apr. 21, 2015

(54) SENSOR ARRAY PROCESSOR WITH MULTICHANNEL RECONSTRUCTION FROM RANDOM ARRAY SAMPLING

(75) Inventors: Ryan B. Casey, San Antonio, TX (US); Christopher B. Smith, Mico, TX (US)

(73) Assignee: Southwest Research Institute, San Antonio, TX (US)

( * ) Notice: Subject to any disclaimer, the term of this patent is extended or adjusted under 35 U.S.C. 154(b) by 799 days.

(21) Appl. No.: 12/966,559

(22) Filed: Dec. 13, 2010

(65) Prior Publication Data

US 2012/0150493 A1      Jun. 14, 2012

(51) Int. Cl.
*G06F 11/00*        (2006.01)
*H03M 7/30*         (2006.01)

(52) U.S. Cl.
CPC .................... *H03M 7/3062* (2013.01)

(58) Field of Classification Search
USPC ........... 702/179, 188, 189; 356/478; 340/525; 257/444
See application file for complete search history.

(56) References Cited

U.S. PATENT DOCUMENTS

| | | | |
|---|---|---|---|
| 6,711,528 B2 * | 3/2004 | Dishman et al. | .............. 702/189 |
| 7,271,747 B2 | 9/2007 | Baraniuk | |
| 7,289,049 B1 | 10/2007 | Fudge | |
| 7,646,924 B2 | 1/2010 | Donoho | |

OTHER PUBLICATIONS

Zou et al., 'Circular Acoustic Vector-Sensor Array for Mode Beam Forming', Aug. 2009, IEEE Publicaiton, vol. 57, No. 8.*

* cited by examiner

*Primary Examiner* — Elias Desta
(74) *Attorney, Agent, or Firm* — Chowdhury & Georgakis P.C.; Ann C. Livingston

(57) ABSTRACT

A method and system for reconstructing random samples taken across multiple sensors of a sensor array, so that each sensor's output is reconstructed. The samples are processed using a compressive sensing process. The compressive sensing process uses a time-space transform basis that represents the multi-channel data in terms of both a frequency component and an azimuthal component.

12 Claims, 1 Drawing Sheet

SENSOR ARRAY PROCESSOR WITH MULTICHANNEL RECONSTRUCTION FROM RANDOM ARRAY SAMPLING

TECHNICAL FIELD OF THE INVENTION

This invention relates to sensor arrays, and more particularly to processing of data from the array.

BACKGROUND OF THE INVENTION

"Array processing" is the term used for signal processing of the outputs of an array of sensors. A "sensor array" is a group of sensors located at spatially separated points.

Array processing focuses on data collected at the sensors to carry out a given task. Example of array processing goals are to determine the number of emitting sources, the locations of these sources, their waveforms, and other signal parameters.

Sensor arrays are used in diverse applications across a broad range of disciplines. Examples of array processing applications are radar, sonar, seismic exploration, and communications.

A sensor array may also be said to be a "multi-channel" array, which means that its output may be delivered in multiple channels to a remote processing system. One of the limiting factors in the development of an array processing system is the cost of adding an additional sensor. For a multi-channel array, much of the cost of the system comes from the many parallel channels of processing, one for each sensor output. The cost is usually driven not by the price of the sensors, but rather by the hardware needed to properly sample and process the input from the sensors.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

A. System and Method Overview

As stated in the Background, conventionally, signals from each sensor of a sensor array are communicated to a computer for processing. This is referred to herein as a "multi-channel" system. The following description is directed to a method and system that simplifies sensor array processing by reducing the many multiple parallel channels to a single channel. The system can sparsely sample a spatially diverse set of sensor elements, and reconstruct the full time-series response of every array element.

Figure 1:
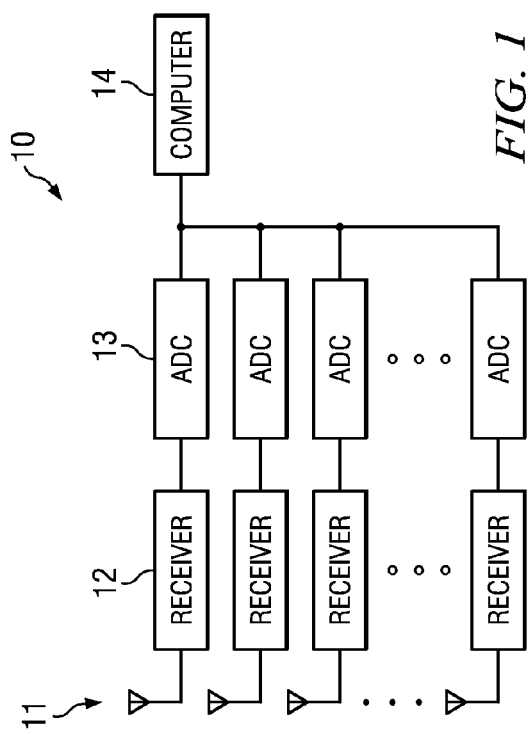
FIG. 1 illustrates a conventional array processing system, in which multiple signals are delivered to a computer for processing.

FIG. 1 illustrates a conventional sensor array processing system 10. A number of sensors 11 each have an associated signal channel (wired or wireless) over which the sensor communicates its sensed signal. At the receiving end, each channel has an associated receiver 12 and a analog-to-digital converter (ADC) 13, which deliver the signal to a computer 14 for processing. In the example of FIG. 1, the multi-channel signals are communicated as analog signals, with conversion to digital data following delivery to multiple receivers 12, but other multi-channel configurations are possible.

Figure 2:
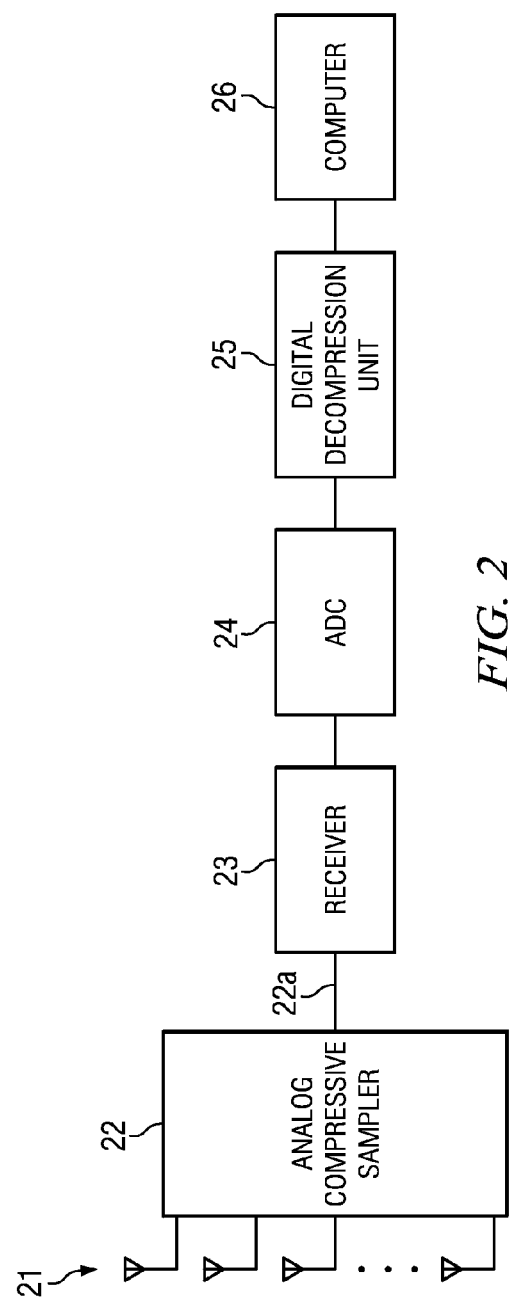
FIG. 2 illustrates a processing system in which data from the sensors is sampled and delivered to a computer as a single signal.

FIG. 2 illustrates a sensor array processing system 20 in accordance with the invention. At the array, an analog compressive sampler 22 samples all the signals, in the manner explained below. Sampler 22 is an array commutator that pseudo-randomly visits each sensor element 21.

A single channel 22a communicates the sampled signal. At the receiving end of the system, a receiver 23 receives the signal and an analog-to-digital converter 24 converts the signal to digital form. A digital decompression unit 25 decompresses the signal. Further processing may be performed by computer 26.

One aspect of the invention is the recognition that known compressive sensing methodologies can be modified to represent both the time-frequency and spatial aspects of array processing. Sections B, C and D below discuss the principles of operation of system 20. Section E discusses how these principles are implemented with system 20.

B. Compressive Sensing Overview

Known compressive sensing methodologies are inherently one-dimensional. Examples of such methodologies are described in U.S. Pat. Nos. 7,646,924, 7,289,049, and 7,271,747. Compressive sensing is also referred to in literature as compressed sensing or compressive sampling Compressive sensing involves the attempt to determine the minimal amount of samples of a signal required to recover the signal within some negligible amount of error. Prior to the development of compressive sensing, a signal is sampled at or above the Nyquist rate and then compressed to reduce the overall number of samples. The ideas behind compressive sensing were the result of investigation into the minimum number of data needed to reconstruct an image even though the number of data would be deemed insufficient by Nyquist sampling criterion. In compressive sensing, the signal is sampled (and simultaneously compressed) at a greatly reduced rate.

A common form of compression is transform coding. Transform coding uses a transform basis that will yield a sparse representation of the signal; transform coefficients that contain little to no information are discarded. Compressive sensing attempts to measure these compressed samples directly. More specifically, compressive sensing samples random projections of the input signal, and determines which set of transform coefficients will give the most sparse representation of the measured random projections. The original signal is then constructed from the sparse transform coefficients.

To describe compressive sensing mathematically, the signal y is directly measured and modeled by:

$$y = \Phi x \quad (1),$$

where y is an m×1 column vector, and the measurement basis matrix $\Phi$ is m×n with each row a basis vector. The value m is the number of measurements of an n length signal, and m<<n. The goal is to recover the signal x from the measurements of signal y. If x is sufficiently sparse, then x can be estimated from y with high probability.

Many signals in the real world can be transformed into a domain where they are sufficiently sparse, that is, they contain many coefficients close to or equal to zero, when represented in some domain. Where x represents the transform coefficients of:

$$u = \Psi x \quad (2)$$

then x is sufficiently sparse.

The sampling projection basis is:

$$y = \Sigma u \qquad (3).$$

Combining Equations (1), (2), and (3) yields:

$$Y = \Sigma \Psi x \qquad (4)$$

with $\Phi = \Sigma \Psi$.

It has been previously shown that x and ultimately u can be determined from Equation (4) by solving the following optimization problem:

$$\min_{x \in \mathfrak{R}} \|x\|_{l_1} \text{ subject to } \|y - \Phi x\|_{l_2} < \epsilon. \qquad (5)$$

C. Multi-Sensor Array Model

This description is directed to the use of compressive sampling techniques for array processing. For purposes of this description, the sensor array is assumed to be a uniform linear antenna array. The method described herein uses a single "processing chain" to sample and communicate the many antenna elements of the array. The goal is to reconstruct the full time series waveform from every antenna, as though all parallel processing chains were present even though only one chain is actually present.

A major challenge for this effort is deriving a basis that is appropriate for representing both the time-frequency and spatial aspects of the array processing problem. Here, the basis is constructed directly from the wave-number vector Fourier transform (WVFT), or the wave equation. The wave equation represents the sensor array's response to excitation in both space and time.

The basic approach to compressive sampling for the uniform linear array, similar to the application of compressive sampling to image processing, is developed using one dimensional signals. However, unlike image processing, the components of the two dimensional basis function are not simply a separable transform like a wavelet or Gabor dictionary. The space and time components of the wave equation are not easily merged into a single basis.

Given a signal $s(n)$ with a baseband equivalent $s_b(n)$, the output of a multi-sensor array having M sensor elements under a narrowband plane wave assumption is given by $$Y_n = v^*(\phi_0) s_b \qquad (6),$$

where $s_b = [s_b(0), s_b(1), \ldots, s_b(N-1)]$ and $Y_n = [y(0), y(1), \ldots, y(N-1)]$ is the multi-channel data with $y(n) = [y_0(n), y_1(n), \ldots, y_{M-1}(n)]^T$ being a column vector of all sensor element outputs for time instance n. The subscript n in $Y_n$ is used to designate the temporal domain.

A multi-sensor array model of the array response associated with the azimuth angle of arrival $\phi_0$ and zero elevation, under the assumption of a uniformly spaced linear array with an element spacing of $\lambda/2$, is given by:

$$v(\phi_0) = \begin{bmatrix} e^{j(0)\pi\cos\phi_0} \\ e^{j(1)\pi\cos\phi_0} \\ \vdots \\ e^{j(M-1)\pi\cos\phi_0} \end{bmatrix} \qquad (7)$$

The above multi-sensor array model is relatively standard and can be found in array processing literature.

The wavenumber-vector Fourier transform is a well documented space-time spectral transform. This transform is given by $$S(k,\omega) = \int_{-\infty}^{\infty} \int_{-\infty}^{\infty} s(x,t) e^{-j(\omega t - k x)} dx dt \qquad (8),$$

where $k = 2\pi/\lambda \, [\cos\phi, \sin\phi]^T$ is the wave-number vector and x is the array element position vector. Assuming a linear array aligned on the x-axis, the position vector and subsequent wavenumber vector become scalars. For a linear array, the wavenumber vector becomes the scalar $k = 2(\pi/\lambda)\cos\phi$. The wavenumber vector k is more esoteric and has a direct dependence on the angle of arrival, $\phi$. For this reason, all subsequent functions relying on k are noted with the variable $\phi$.

Using a discrete Fourier transform (DFT) like discretization of Equation (8), with discrete steps in $\omega$ and the angle of arrival, $\phi$, then Equation (8) can be rewritten as $$S_{\phi,\omega} = V_\phi^T Y_n W_\omega \qquad (9)$$

where $$V_\phi = \left[ v(\pi\cos(0)), v(\pi\cos(\delta_\phi)), \ldots, v\left(\pi\cos\left(\left(\frac{360}{\delta_\phi} - 1\right)\delta_\phi\right)\right) \right] \qquad (10)$$

and $$W_\omega = \left[ w(0), w(\delta_n), \ldots, w\left(\left(\frac{N}{\delta_u} - 1\right)\delta_n\right) \right] \qquad (11)$$

Here $\delta_\phi$ and $\delta_n$ are the desired angular resolution and desired temporal resolution, respectively. The vector $v(\phi)$ is given by Equation (7) and $w(\omega) = [e^{-j\omega(0)}, e^{-j\omega(1)}, \ldots, e^{-j\omega(N-1)}]^T$.

The wave-number vector Fourier transform (WVFT) represents the multi-channel data in terms of a frequency component $\omega$ and an azimuthal component $\phi$. This basis is inherently sparse for a narrowband signal that is assumed to be a propagating plane wave.

D. Multi-Sensor Array Model with Compressive Sensing

The array model described in the previous section provides a transform that allows for a sparse representation of multi-channel data by using the WVFT. However, in the above state, the WVFT model does not fit into the compressive sensing model.

If the multi-channel data $Y_n$ is raster scanned, or vectorized, then:

$$\hat{y} = vec(Y_n) \qquad (12)$$

$$= vec\left((V_\phi^T)^\dagger \hat{S}_{\phi,\omega} W_\omega^H\right)$$

$$= \underbrace{\left(W_\omega^* \otimes (V_\phi^T)^\dagger\right)}_{W_{\omega,\phi}^\dagger} vec(\hat{S}_{\phi,\omega})$$

$$= W_{\omega,\phi}^\dagger \hat{s},$$

where the notation $A^\dagger$ represents the pseudoinverse of A and the $\otimes$ is the Kronecker product.

The compressive sensing transform defined in Equation (2) is equivalent to Equation (12). In this representation, the transform basis $\Psi=W^\dagger_{\omega,\phi}$. Conversely the space-time transformation is given by:

$$\hat{s} = vec(S_{\phi,\omega}) \quad (13)$$
$$= vec(V_\phi^T Y_n W_\omega)$$
$$= \frac{(W_\omega^T \otimes V_\phi^T)}{W_{\omega,\phi}} vec(Y_n)$$
$$= W_{\omega,\phi} \hat{y}.$$

The next step is to construct the compressive sampling basis $\Sigma$ shown in Equation (3). The sampling basis will reduce the effective sampling rate by 1/M by sampling $\hat{y}$ every Mn+i where i is chosen randomly from the set $\{0, 1, \ldots, M-1\}$ and n=0, 1, ..., N. The resulting sampling basis has the following structure:

$$\Sigma = (I_N \circ E)^T \quad (14)$$

where the symbol ○ represents a Khatri-Rao product. The resulting matrix E is in the vector space $C^{M \times NM}$. Here $I_N$ is the N×N identity matrix and the matrix $E \in C^{M \times N}$ is composed of elementary column vectors $e_i$ where i indicates the array element being sampled.

The compressive measurements given in Equation (3) are performed by:

$$\tilde{y} = (I_N \circ E)^T \hat{y} \quad (15)$$

The compressive sampling model for multi-sensor array processing can now be written, following array processing notation, as:

$$\tilde{Y} = (I_N \circ E)^T W_{\phi,\omega}^\dagger \hat{s} \quad (16)$$

This model provides a compressive sensing method that exploits the azimuth and elevation responses of the array.

The recovery of the sparse set of coefficients is achieved, using optimization, by searching for the signal with the sparsest coefficients that agrees with the M observed measurements in y.

E. Implementation of Compressive Sensing Array Model

Referring again to FIG. 2, in the example of this description, the sensor array is an array of antenna elements. However, the same concepts may be applied to any sensor array, whose sensors output a time varying signal having time-frequency characteristics and for which WVFT processing is appropriate.

Referring again to FIG. 2, as stated above, sampler 22 performs analog sampling by pseudo-randomly visiting each element of the sensor array. Sampler 22 samples each element 21 in a pseudo-random order. This order is known to decompression unit 25, such as by decompression unit providing sampler 22 with this order, or because sampler 22 informs decompression unit 25. A "pseudo-random" or "random" sampling order may be generated by various known pseudo-random number methods, and does not preclude true random ordering.

In this manner, sampler 22 generates an analog signal containing randomly sampled output from all of the sensor elements 21. Sampler 22 delivers this signal to receiver 23, via a wired or wireless communications. Typically, receiver 23 is remote from the sensor array 21 and sampler 22. An analog-to-digital unit 24 converts the signal to digital data.

Digital decompression unit 25 is programmed to reconstruct the data samples into a data representing a signal from each sensor element 21. Decompression unit 25 may be implemented with appropriate hardwire, firmware, or software. For example, decompression unit 25 may be implemented with logic circuitry, such as a field programmable gate array. Or, decompression unit 25 may be implemented with a general purpose processing unit that executes instructions. Programming for the hardware or firmware implements the processes discussed herein.

As explained above, a space-time compressive sampling model is achieved by substituting $u=\hat{y}$, $x=\hat{s}$, and $\Psi=W^\dagger_{\omega\phi}$ in the general compressive sampling model and integrating the sampling matrix developed. The transform basis is a space-time Fourier transform, such as a WVFT. This new compressive sampling model is the $l_1$ minimization of the vectorized WVFT coefficients, subject to the constraint that the error between the inverse of the coefficients and the original random samples is within a specified bound, given as:

$$\min_{\hat{s} \in C} \|\hat{s}\|_{l_1} \text{ subject to } \|y - \Phi\hat{s}\|_{l_2} < \epsilon$$

In the optimization, the random space time samples are acquired by $$y = \Sigma \hat{y} = (I_N \circ (E \otimes b))^T vec(Y_n)$$

The transform for the sparse coefficients is given as $$\hat{y} = W_{\omega\phi}^\dagger \hat{s} = (W_\omega^* \otimes (V_\phi^T)^\dagger) vec(S)$$

The "sensing matrix" in the optimization is given by the product of the sampling matrix and the transform as:

$$\Phi = \Sigma\Psi = (I_N \circ (E \otimes b))^T (W_\omega^* \otimes (V_\phi^T)^\dagger)$$

The WVFT transform exploits features of the sensor element outputs in the sense that their time-varying signal frequency is sparse and a signal propagates in one direction. Both signal characteristics, frequency and azimuth, contribute to the sparsity of the transform. The random samples are from different sensor elements, located at different points in space, at different times. The sparsity of the frequency and azimuth domains allow WVFT transform coefficients to be computed.

As an experimental example of reconstruction, demonstrating the preservation of both the frequency and azimuthal information in the reconstruction, an antenna array output was simulated by an excitation signal composed of the summation of two sinusoids at 500 Hz and 750 Hz that are modulated to a carrier frequency matched to the array bandwidth. The output of the array was baseband, and the complete sample rate of a continuously sampled channel was 1 kHz. The array is a uniformly spaced linear array with 4 elements. The vector given in Equation (10) is broken into steps of five degrees. The array is randomly sampled using Equation (15), with an effective sample rate of 250 Hz per channel. The complete multi-channel data is reconstructed using a Douglas Rachford Noiseless Basis Pursuit Algorithm.

What is claimed is:

1. A method of acquiring multi-channel data from a multi-sensor sensor array, the array having multiple sensor elements each of which produce an output signal, comprising:

using an array sampler to pseudo-randomly sample the output signal of each element, thereby acquiring a single-channel signal that represents the sampled output of all sensor elements;

converting the single-channel signal to digital data;

delivering the digital data to a decompression unit operable to construct a signal from each sensor element of the multiple sensor elements, using a compression sensing matrix;

wherein the compression sensing matrix is formed from a sampling matrix and a transform matrix;

wherein the transform matrix represents the multi-channel data in terms of a frequency domain and an azimuthal domain; and wherein the sampling matrix is derived from an array vector matrix comprising vectors $e_i$ where i indicates the array element being sampled.

2. The method of claim 1, wherein the sensor array is an antenna sensor array.

3. The method of claim 1, wherein the transform matrix is derived from a space-time transform.

4. The method of claim 3, wherein the space-time transform is a wavenumber vector Fourier transform.

5. The method of claim 1, wherein the sampling matrix is a product of an identity matrix and the array vector matrix.

6. A system for sampling and reconstructing the output of a multi-sensor sensor array, the array having multiple sensor elements each of which produce an output signal, comprising:

an array sampler configured to pseudo-randomly sample the output signal of each element, thereby acquiring a single-channel signal that represents the sampled output of all sensor elements;

a receiver operable to receive the single-channel signal;

a converter operable to convert the single-channel signal to digital data;

a decompression unit operable to construct a signal from each sensor element of the multiple sensor elements from the digital data, using a compression sensing matrix;

wherein the compression sensing matrix is formed from the sampling matrix and the transform matrix;

wherein the transform matrix represents the multi-channel data in terms of a frequency domain and an azimuthal domain; and wherein the sampling matrix is derived from an array vector matrix comprising vectors $e_i$ where i indicates the array element being sampled.

7. The system of claim 6, wherein the sensor array is an antenna sensor array.

8. The system of claim 6, wherein the transform matrix is derived from a space-time transform.

9. The system of claim 8, wherein the space-time transform is a wavenumber vector Fourier transform.

10. The system of claim 6, wherein the sampling matrix is a product of an identity matrix and the array vector matrix.

11. The system of claim 6, wherein the decompression unit is implemented with firmware.

12. The system of claim 6, wherein the decompression unit is implemented with software.

* * * * *